(12) United States Patent
Yun et al.

(10) Patent No.: US 11,964,360 B2
(45) Date of Patent: Apr. 23, 2024

(54) POLISHING PAD COMPRISING WINDOW SIMILAR IN HARDNESS TO POLISHING LAYER

(71) Applicant: SK enpulse Co., Ltd., Gyeonggi-do (KR)

(72) Inventors: Sunghoon Yun, Gyeonggi-do (KR); Joonsung Ryou, Gyeonggi-do (KR); Jang Won Seo, Busan (KR); Jaein Ahn, Gyeonggi-do (KR)

(73) Assignee: SK ENPULSE CO., LTD., Gyeonggi-do (KR)

( * ) Notice: Subject to any disclaimer, the term of this patent is extended or adjusted under 35 U.S.C. 154(b) by 1138 days.

(21) Appl. No.: 16/619,378

(22) PCT Filed: Jul. 10, 2018

(86) PCT No.: PCT/KR2018/007805
§ 371 (c)(1),
(2) Date: Dec. 4, 2019

(87) PCT Pub. No.: WO2019/013523
PCT Pub. Date: Jan. 17, 2019

(65) Prior Publication Data
US 2020/0164483 A1    May 28, 2020

(30) Foreign Application Priority Data
Jul. 11, 2017   (KR) .......................... 10-2017-0087720

(51) Int. Cl.
*B24B 37/20*      (2012.01)
*B24B 37/00*      (2012.01)
*B24B 37/24*      (2012.01)
*B24D 3/00*       (2006.01)
*B24D 3/22*       (2006.01)

(52) U.S. Cl.
CPC ............ *B24B 37/205* (2013.01); *B24B 37/00* (2013.01); *B24B 37/20* (2013.01); *B24B 37/24* (2013.01); *B24D 3/00* (2013.01); *B24D 3/22* (2013.01)

(58) Field of Classification Search
CPC ......... B24B 37/00; B24B 37/20; B24B 37/24; B24B 37/205; B24D 3/00; B24D 3/22
See application file for complete search history.

(56) References Cited

U.S. PATENT DOCUMENTS 9,259,820 B2\*  2/2016  Qian ....................... H01F 41/00
2004/0033758 A1  2/2004  Wiswesser

FOREIGN PATENT DOCUMENTS

JP   2001-015861 A   1/2001
JP   2003-507199 A   2/2003
(Continued)

*Primary Examiner* — James A Fiorito
*Assistant Examiner* — Ross J Christie
(74) *Attorney, Agent, or Firm* — IP & T GROUP LLP

(57) ABSTRACT

Embodiments relate to a polishing pad, which comprises a window having a hardness similar to that of its polishing layer. Since the polishing pad comprises a window having a hardness and a polishing rate similar to those of its polishing layer, it can produce an effect of preventing scratches on a wafer during a CMP process. In addition, the polishing layer and the window of the polishing pad have a similar rate of change in hardness with respect to temperature, so that they can maintain a similar hardness despite a change in temperature during the CMP process.

7 Claims, 1 Drawing Sheet

(56) References Cited

FOREIGN PATENT DOCUMENTS

| | | |
|---|---|---|
| JP | 2006-527476 | 11/2006 |
| JP | 2009-066675 | 4/2009 |
| JP | 2011-031392 | 2/2011 |
| JP | 2011-051045 A | 3/2011 |
| JP | 2015-047691 A | 3/2015 |
| JP | 2015-211224 A | 11/2015 |
| KR | 10-2003-0047893 | 6/2003 |
| KR | 10-0707959 | 4/2007 |
| KR | 10-2014-0144075 | 12/2014 |

\* cited by examiner

POLISHING PAD COMPRISING WINDOW SIMILAR IN HARDNESS TO POLISHING LAYER

This application is a national stage application of PCT/KR2018/007805 filed on Jul. 10, 2018, which claims priority of Korean patent application number 10-2017-0087720 filed on Jul. 11, 2017. The disclosure of each of the foregoing applications is incorporated herein by reference in its entirety.

TECHNICAL FIELD

Embodiments relate to a polishing pad, which comprises a window having a hardness similar to that of its polishing layer. Since the polishing pad comprises a window having a hardness and a polishing rate similar to those of its polishing layer, it can produce an effect of preventing scratches on a wafer during a chemical mechanical planarization (CMP) process.

BACKGROUND ART

A polishing pad for a CMP process is an essential element that plays an important role in the CMP process for the fabrication of semiconductors. It plays an important role in materializing the performance of the CMP process. The CMP process refers to a step for planarizing the surface of a semiconductor wafer in order to facilitate subsequent process steps. Various methods have been proposed to determine when a semiconductor wafer has been polished to a desired extent in such a CMP process. For example, a technique has been proposed in which a semiconductor wafer is optically inspected to determine the termination point of polishing. The optical inspection can be carried out by forming a transparent window in a polishing pad, which is capable of detecting the polishing status or the like, and utilizing an optical signal such as a laser through the window. The termination point is determined through the changes in reflectance of the surface during the planarization process.

Unlike a polishing layer, the window is generally made to be transparent without a microstructure and a pattern in order to increase the transmittance (see Korean Patent No. 0707959). But such structural characteristics of a window would give rise to differences in such physical properties as polishing rate and hardness between the polishing layer and the window in a CMP process, which may cause such defects as scratches on the surface of a wafer during the CMP process.

DISCLOSURE OF INVENTION

Technical Problem

Therefore, an object of the embodiments is to provide a polishing pad, which comprises a window having a hardness and a polishing rate similar to those of its polishing layer and is capable of preventing such defects as scratches on the surface of a wafer during a CMP process.

Solution to the Problem

According to an embodiment, there is provided a polishing pad, which comprises a polishing layer having a penetrating hole; and a window inserted in the penetrating hole, wherein the difference in wet hardness between the window and the polishing layer is 0.1 Shore D to 12 Shore D, and the wet hardness is a surface hardness measured upon immersion in water for 30 minutes.

Advantageous Effects of Invention

The polishing pad according to the embodiments comprises a window having a hardness and a polishing rate similar to those of its polishing layer and is capable of preventing such defects as scratches on the surface of a wafer during a CMP process.

In addition, the polishing layer and the window of the polishing pad according to the embodiments have a similar rate of change in hardness with respect to temperature, so that they can maintain a similar hardness despite a change in temperature during a CMP process.

BRIEF DESCRIPTION OF DRAWINGS

FIGS. 1A, 1B and 2 show the cross-section of a polishing pad according to an

<Reference Numerals of the Drawings>

101: polishing layer  
102: window  
103: adhesive layer  
104: support layer  
201: penetrating hole or first penetrating hole  
202: second penetrating hole  
203: third penetrating hole

BEST MODE FOR CARRYING OUT THE INVENTION

The polishing pad according to an embodiment comprises a polishing layer having to a penetrating hole; and a window inserted in the penetrating hole, wherein the difference in wet hardness between the window and the polishing layer is 0.1 Shore D to 12 Shore D, and the wet hardness is a surface hardness measured upon immersion in water for 30 minutes.

Figure 1A:
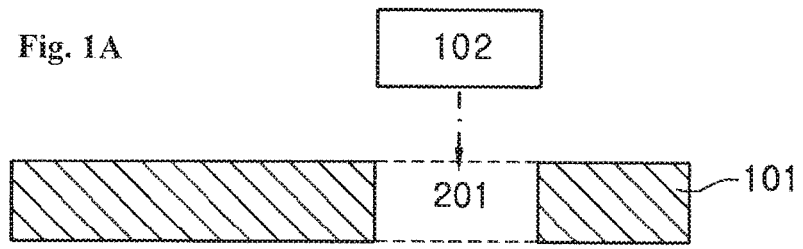
Figure 1B:
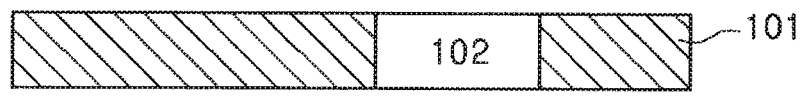

Referring to FIG. 1, the polishing pad according to an embodiment comprises a polishing layer (101) having a penetrating hole (201) and a window (102) inserted in the penetrating hole.

Window

The window may have a wet hardness of 50 Shore D to 75 Shore D in the temperature range of 30° C. to 70° C. Specifically, the window may have a wet hardness of 50 Shore D to 65 Shore D, 52 Shore D to 65 Shore D, 52 Shore D to 63 Shore D, or 60 Shore D to 75 Shore D in the temperature range of 30° C. to 70° C.

The window may have a wet hardness of 60 Shore D to 75 Shore D at a temperature of 30° C. In addition, the window may have a wet hardness of 56 Shore D to 68 Shore D at a temperature of 50° C. Further, the window may have a wet hardness of 50 Shore D to 66 Shore D at a temperature of 70° C. Specifically, the window may have a wet hardness of 60 Shore D to 63 Shore D at a temperature of 30° C., a wet hardness of 55 Shore D to 58 Shore D at a temperature of 50° C., and a wet hardness of 50 Shore D to 53 Shore D at a temperature of 70° C.

The window may have a rate of reduction in wet hardness of 20 Shore D/° C. to 25 Shore D/° C. in the temperature range of 30° C. to 70° C. The rate of reduction in wet hardness may be calculated by the following Equation 1. Specifically, the window may have a rate of reduction in wet hardness of 21 Shore D/° C. to 23 Shore D/° C. in the temperature range of 30° C. to 70° C.

Rate of reduction in wet hardness=(wet hardness at 30° C.−wet hardness at 70° C.)×100/(70° C.−30° C.)   [Equation 1]

The window may be formed from a window composition that comprises a second urethane-based prepolymer and a curing agent. The content of the unreacted isocyanate group (NCO) in the second urethane-based prepolymer may be 8.1% by weight to 9.0% by weight. Specifically, the content of the unreacted isocyanate group (NCO) in the second urethane-based prepolymer may be 8.5% by weight to 9.0% by weight.

A prepolymer generally refers to a polymer having a relatively low molecular weight wherein the degree of polymerization is adjusted to an intermediate level for the sake of convenient molding a product in the process of producing the same. A prepolymer may be molded by itself or after a reaction with another polymerizable compound. Specifically, the urethane-based prepolymer may be prepared by reacting an isocyanate compound with a polyol and may comprise an unreacted isocyanate group (NCO).

The curing agent may be at least one selected from an amine compound and an alcohol compound. Specifically, the curing agent may comprise at least one compound selected from the group consisting of an aromatic amine, an aliphatic amine, an aromatic alcohol, and an aliphatic alcohol. For example, the curing agent may be at least one selected from the group consisting of 4,4'-methylenebis(2-chloroaniline) (MOCA), diethyltoluenediamine, diaminodiphenylmethane, diaminodiphenylsulfone, m-xylylenediamine, isophoronediamine, ethylenediamine, diethylenetriamine, triethylenetetramine, polypropylenediamine, polypropylenetriamine, ethylene glycol, diethylene glycol, dipropylene glycol, butanediol, hexanediol, glycerin, trimethylolpropane, and bis(4-amino-3-chlorophenyl)methane.

The window may have the same size as that of the penetrating hole.

The window may be a non-foam. Since the window has no microbubbles therein, it is possible to reduce the possibility for a polishing liquid to penetrate into the polishing pad, resulting in improvements in the accuracy of optically detecting the termination point and prevention of damage to the light transmission region.

The window may have a light transmittance of 20% or higher or 30% or higher for light of 400 nm to 700 nm.

Polishing Layer

The polishing layer may have a wet hardness of 45 Shore D to 65 Shore D in the temperature range of 30° C. to 70° C. Specifically, the polishing layer may have a wet hardness of 50 Shore D to 65 Shore D or 50 Shore D to 61 Shore D in the temperature range of 30° C. to 70° C.

The polishing layer may have a wet hardness of 55 Shore D to 65 Shore D at a temperature of 30° C. In addition, the polishing layer may have a wet hardness of 50 Shore D to 60 Shore D at a temperature of 50° C. Further, the polishing layer may have a wet hardness of 45 Shore D to 55 Shore D at a temperature of 70° C. Specifically, the polishing layer may have a wet hardness of 55 Shore D to 61 Shore D at a temperature of 30° C., a wet hardness of 53 Shore D to 56 Shore D at a temperature of 50° C., and a wet hardness of 50 Shore D to 53 Shore D at a temperature of 70° C.

The polishing layer may have a rate of reduction in wet hardness of 20 Shore D/° C. to 30 Shore D/° C. in the temperature range of 30° C. to 70° C. The rate of reduction in wet hardness may be calculated by the following Equation 1. Specifically, the polishing layer may have a rate of reduction in wet hardness of 23 Shore D/° C. to 27 Shore D/° C. in the temperature range of 30° C. to 70° C.

Rate of reduction in wet hardness=(wet hardness at 30° C.−wet hardness at 70° C.)×100/(70° C.−30° C.)   [Equation 1]

The polishing layer may be formed from a polishing layer composition that comprises a first urethane-based prepolymer, a curing agent, and a foaming agent. The content of the unreacted isocyanate group (NCO) in the first urethane-based prepolymer may be 7.5% by weight to 9.5% by weight. Specifically, the content of the unreacted isocyanate group (NCO) in the first urethane-based prepolymer may be 8.0% by weight to 8.5% by weight.

The urethane-based prepolymer may be prepared by reacting an isocyanate compound with a polyol and may comprise an unreacted isocyanate group (NCO).

The difference in the content of the unreacted isocyanate groups (NCO) between the first urethane-based prepolymer and the second urethane-based prepolymer may be 0.4% by weight to 1.0% by weight. Specifically, the difference in the content of the unreacted isocyanate groups (NCO) between the first urethane-based prepolymer and the second urethane-based prepolymer may be 0.5% by weight to 0.8% by weight.

The curing agent is as described in the above with respect to the window.

The foaming agent is not particularly limited as long as it is commonly used for forming voids in a polishing pad. For example, the foaming agent may be at least one selected from the group consisting of a solid foaming agent having a void, a liquid foaming agent filled with a volatile liquid, and an inert gas.

The thickness of the polishing layer is not particularly limited. For example, it may be 0.8 mm to 5.0 mm, 1.0 mm to 4.0 mm, or 1.0 mm to 3.0 mm.

As a specific example, the polishing layer may be formed from a polishing layer composition that comprises a first urethane-based prepolymer, a curing agent, and a foaming agent; and the window may be formed from a window composition that comprises a second urethane-based prepolymer and a curing agent, wherein the difference in the content of the unreacted isocyanate groups (NCO) between the first urethane-based prepolymer and the second urethane-based prepolymer may be 0.4% by weight to 1.0% by weight.

In addition, the content of the unreacted isocyanate group (NCO) in the first urethane-based prepolymer may be 7.5% by weight to 9.5% by weight; and the content of the unreacted isocyanate group (NCO) in the second urethane-based prepolymer may be 8.1% by weight to 9.0% by weight.

Properties of the Window and the Polishing Layer

The difference in wet hardness between the window and the polishing layer may be 0.1 Shore D to 12 Shore D. Specifically, the difference in wet hardness between the window and the polishing layer may be 0.1 Shore D to 10 Shore D. More specifically, the wet hardness of the window may be greater than the wet hardness of the polishing layer by 0.1 Shore D to 10 Shore D, 0.1 Shore D to 8 Shore D, 0.5 Shore D to 8 Shore D, or 1 Shore D to 5 Shore D.

If the difference in wet hardness between the window and the polishing layer is within the above range, it is advantageous to prevent defects on the surface of a wafer during a CMP process, and it is possible to minimize the possibilities that a polishing liquid penetrates into the polishing pad due to the deformation of the window, resulting in an error in the detection of the termination point.

In addition, the polishing layer may have a wet hardness of 45 Shore D to 65 Shore D in the temperature range of 30°

C. to 70° C., and the window may have a wet hardness of 50 Shore D to 75 Shore D in the temperature range of 30° C. to 70° C.

In addition, the difference in the rate of reduction in wet hardness between the window and the polishing layer may be 1 Shore D/° C. to 5 Shore D/° C. in the temperature range of 30° C. to 70° C. Here, the rate of reduction in wet hardness may be calculated by the above Equation 1. Specifically, the difference in the rate of reduction in wet hardness between the window and the polishing layer may be 1 Shore D/° C. to 3 Shore D/° C., 2 Shore D/° C. to 4 Shore D/° C., or 3 Shore D/° C. to 5 Shore D/° C.

The polishing pad may have a deviation in hardness between the window and the polishing layer of 0.1% to 13% in the temperature range of 30° C. to 70° C. The deviation in hardness may be calculated by the following Equation 2. Specifically, the polishing pad may have a deviation in hardness between the window and the polishing layer of 0.1% to 10%, 0.5% to 10%, 1% to 8%, or 2% to 7%, in the temperature range of 30° C. to 70° C.

Deviation in hardness=(wet hardness of a window−wet hardness of a polishing layer)×100/(wet hardness of a polishing layer)  [Equation 2]

If the deviation in hardness between the window and the polishing layer is within the above range, it is possible to maintain a similar hardness despite a change in temperature during a CMP process, thereby further preventing such defects as scratches on the surface of a wafer during a CMP process.

The window may have a wear rate that is the same as, or slightly higher than, the wear rate of the polishing layer. In such event, it is possible to prevent the problem that the window portion only is protruded after polishing is carried out for a certain period of time, whereby scratches are generated on the wafer to be polished. Specifically, the wear rate of the polishing layer may be 80% to 100% of the wear rate of the window. More specifically, the wear rate of the polishing layer may be 90% to 100% of the wear rate of the window.

Here, the wear rate is measured as a percentage of the weight worn by polishing relative to the weight before polishing while the polishing is conducted under the conditions of a load of 1,000 g, an abrasive wheel of H-22, and a rotation of 1,000 revolutions with a wear tester (e.g., Model 174, Taber).

MODE FOR THE INVENTION

Hereinafter, the present invention is explained in detail by the following Examples. However, these examples are set forth to illustrate the present invention, and the scope of the present invention is not limited thereto.

Example 1: Production of a Polishing Pad 1-1: Preparation of a Polishing Layer

In a casting machine equipped with feeding lines for a urethane-based prepolymer, a curing agent, an inert gas, and a reaction rate controlling agent, PUGL-550D (SKC) having an unreacted NCO content of 8.0% by weight was charged to the prepolymer tank, and bis(4-amino-3-chlorophenyl) methane (Ishihara) was charged to the curing to agent tank. A1 (Air Product) as a reaction rate controlling agent and argon (Ar) as an inert gas were prepared.

The urethane-based prepolymer, the curing agent, the reaction rate controlling agent, and the inert gas were stirred while they were fed to the mixing head at constant rates through the respective feeding lines. In such event, the molar equivalent ratio of the NCO group in the urethane-based prepolymer to the reactive groups in the curing agent was adjusted to 1:1, and the total feeding amount was maintained at a rate of 10 kg/min. In addition, the reaction rate controlling agent was fed in an amount of 0.5 part by weight based on 100 parts by weight of the urethane-based prepolymer. The argon gas was fed in a volume of 20% based on the total volume of the urethane-based prepolymer. The mixed raw materials were injected into a mold (having a width of 1,000 mm, a length of 1,000 mm, and a height of 3 mm) and solidified to obtain a polishing layer in the form of a sheet.

Thereafter, the surface of the polishing layer was ground to adjust the average thickness to 2 mm.

1-2: Preparation of a Window

A window in the form of a cake was obtained in the same manner as in the above step 1-1, except that PUGL-500D (SKC) having an unreacted NCO content of 8.5% by weight was used as a urethane-based prepolymer, an inert gas was not fed, and the stirred raw materials were injected into a mold (having a width of 1,000 mm, a length of 1,000 mm, and a height of 50 mm).

The cake was cut and ground to produce twenty windows in the form of a sheet having an average thickness of 1.9 mm. The window in the form of a sheet was punched to obtain a window having a width of 20 mm, a length of 60 mm, and a thickness of 1.9 mm.

1-3: Support Layer

A non-woven type support layer (manufacturer: PTS, product name: ND-5400H) having a thickness of 1.1 T was used.

1-4: Preparation of a Polishing Pad

Figure 2:
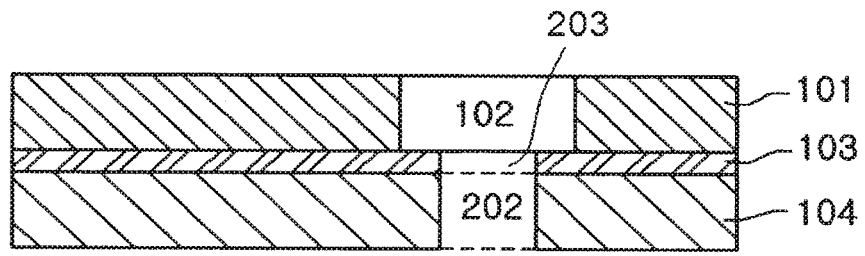

The polishing layer obtained in the above step 1-1 was punched at a width of 20 mm and a length of 60 mm to form a first penetrating hole, and the support layer obtained in the above step 1-3 was punched at a width of 16 mm and a length of 56 mm to form a second penetrating hole. Then, the polishing layer was thermally bonded to one side of the support layer at 120° C. with a hot-melt film (manufacturer SKC, product name: TF-00). A double-sided adhesive tape (manufacturer: 3M, product name: 442JS) was attached to the other side of the support layer. The double-sided adhesive tape corresponding to the second penetrating hole was cut and removed to form a third penetrating hole. The window obtained in the above step 1-2 was inserted into the first penetrating hole and adhered to the double-sided adhesive tape to prepare a polishing pad (see FIG. 2).

Example 2

A polishing pad was prepared in the same manner as in Example 1, except that PUGL-550D (SKC) having an unreacted NCO content of 9.1% by weight was used as a urethane-based prepolymer in the production of a window.

Comparative Example 1

A polishing pad was prepared in the same manner as in Example 1, except that PUGL-450D (SKC) having an unreacted NCO content of 8.0% by weight was used as a urethane-based prepolymer in the production of a window.

Test Example: Measurement of Wet Hardness with Respect to Temperature

The polishing layers and the windows prepared in Examples 1 and 2 and Comparative Example 1 were each cut into a size of 2 cm×2 cm (thickness: 2 mm), immersed in water at 30° C., 50° C., or 70° C. for 30 minutes, and the hardness was measured using a hardness meter (D-type hardness meter). The measurement results are shown in Table 1 below.

The difference in wet hardness between the window and the polishing layer was calculated for each temperature from the measured wet hardness values. The deviation in hardness was calculated by the following Equation 2, and the rate of reduction in wet hardness was calculated by the following Equation 1. The calculation results are shown in Table 1 below.

Rate of reduction in wet hardness=(wet hardness at 30° C.−wet hardness at 70° C.)×100/(70° C.−30° C.)  [Equation 1]

Deviation in hardness=(wet hardness of a window−wet hardness of a polishing layer)×100/(wet hardness of a polishing layer)  [Equation 2]

TABLE 1

|  |  | Polishing layer | Window Ex. 1 | Ex. 2 | C. Ex. 1 |
|---|---|---|---|---|---|
| Wet hardness (shore D) | 30° C. | 60.5 | 62.2 | 70.8 | 68.8 |
|  | 50° C. | 55.7 | 57.3 | 65.9 | 67.8 |
|  | 70° C. | 50.2 | 53.1 | 61.7 | 66.6 |
| Difference in wet hardness (shore D) | 30° C. | — | 1.7 | 10.3 | 8.8 |
|  | 50° C. | — | 1.6 | 10.2 | 12.1 |
|  | 70° C. | — | 2.9 | 11.5 | 16.4 |
| Deviation in hardness (%) | 30° C. | — | 2.81 | 17.02 | 14.5 |
|  | 50° C. | — | 2.87 | 18.31 | 21.7 |
|  | 70° C. | — | 5.78 | 22.91 | 32.67 |
| Rate of reduction in wet hardness (shore D/° C.) |  | 25.75 | 22.75 | 22.75 | 5.50 |

As shown in Table 1, the polishing pads of Examples 1 and 2 each had a difference in wet hardness of less than 12 Shore D between the polishing layer and the window. Particularly, the polishing pad of Example 1 had a remarkably low difference in wet hardness of 3 Shore D or less between the polishing layer and the window. In contrast, the polishing pad of Comparative Example 1 had a difference in wet hardness of 16.4 Shore D to the maximum between the polishing layer and the window. If the polishing pad of Comparative Example 1 were used in a CMP process, there would be a problem that such defects as scratches are generated on the surface of a wafer.

In addition, the polishing pad of Example 1 had a remarkable low deviation in hardness of less than 6% between the polishing layer and the window, whereas the polishing pad of Comparative Example 1 had a very high deviation in hardness of 30%/o or more to the maximum between the polishing layer and the window.

Further, in the polishing pads of Examples 1 and 2, the rate of reduction in wet hardness of the polishing layer was similar to that of the window. Thus, it was possible to maintain a similar hardness despite a change in temperature during a CMP process, thereby preventing such defects as scratches on the surface of a wafer. In contrast, the polishing pad of Comparative Example 1 had a difference in the rate of reduction in wet hardness of 20 Shore D/° C. or higher between the polishing layer and the window.

The invention claimed is:

1. A polishing pad, which comprises:
a polishing layer having a penetrating hole; and
a window inserted in the penetrating hole,
wherein the difference in wet hardness between the window and the polishing layer is 0.1 Shore D to 12 Shore D, and the wet hardness is a surface hardness measured upon immersion in water for 30 minutes,
wherein the polishing layer is formed from a polishing layer composition that comprises a first urethane-based prepolymer, a curing agent, and a foaming agent; and the window is formed from a window composition that comprises a second urethane-based prepolymer and a curing agent, wherein the difference in the content of the unreacted isocyanate groups (NCO) between the first urethane-based prepolymer and the second urethane-based prepolymer is 0.4% by weight to 1.0% by weight, and
wherein the content of the unreacted isocyanate group (NCO) in the first urethane-based prepolymer is 7.5% by weight to 9.5% by weight; and the content of the unreacted isocyanate group (NCO) in the second urethane-based prepolymer is 8.1% by weight to 9.0% by weight.

2. The polishing pad of claim 1, wherein the window has a rate of reduction in wet hardness of 20 Shore D/° C. to 25 Shore D/° C. in the temperature range of 30° C. to 70° C., and the rate of reduction in wet hardness is calculated by the following Equation 1:

Rate of reduction in wet hardness=(wet hardness at 30° C.−wet hardness at 70° C.)×100/(70° C.−30° C.).  [Equation 1]

3. The polishing pad of claim 1, wherein the difference in the rate of reduction in wet hardness between the window and the polishing layer is 1 Shore D/° C. to 5 Shore D/° C. in the temperature range of 30° C. to 70° C., and the rate of reduction in wet hardness is calculated by the following Equation 1:

Rate of reduction in wet hardness=(wet hardness at 30° C.−wet hardness at 70° C.)×100/(70° C.−30° C.).  [Equation 1]

4. The polishing pad of claim 1, wherein the deviation in hardness between the window and the polishing layer is 0.1% to 13% in the temperature range of 30° C. to 70° C., and the deviation in hardness is calculated by the following Equation 2:

Deviation in hardness=(wet hardness of a window−wet hardness of a polishing layer)×100/(wet hardness of a polishing layer).  [Equation 2]

5. The polishing pad of claim 1, wherein the difference in wet hardness between the window and the polishing layer is 0.1 Shore D to 10 Shore D.

6. The polishing pad of claim 1, wherein the polishing layer has a wet hardness of 45 Shore D to 65 Shore D in the temperature range of 30° C. to 70° C.; and the window has a wet hardness of 50 Shore D to 75 Shore D in the temperature range of 30° C. to 70° C.

7. The polishing pad of claim 1, wherein the wear rate of the polishing layer is 80% to 100% of the wear rate of the window.

\* \* \* \* \*